United States Patent
Scholten

(10) Patent No.: US 9,019,717 B2
(45) Date of Patent: Apr. 28, 2015

(54) DEVICE WITH AN INTEGRATED CIRCUIT

(71) Applicant: Micronas GmbH, Freiburg (DE)

(72) Inventor: Gerd Scholten, Munich (DE)

(73) Assignee: Micronas GmbH, Freiburg (DE)

( * ) Notice: Subject to any disclaimer, the term of this patent is extended or adjusted under 35 U.S.C. 154(b) by 69 days.

(21) Appl. No.: 13/683,286

(22) Filed: Nov. 21, 2012

(65) Prior Publication Data

US 2013/0128483 A1 May 23, 2013

Related U.S. Application Data

(60) Provisional application No. 61/563,998, filed on Nov. 28, 2011.

(30) Foreign Application Priority Data

Nov. 21, 2011 (DE) .......................... 10 2011 118 932

(51) Int. Cl.
*H01L 23/50* (2006.01)
*H01L 23/495* (2006.01)

(52) U.S. Cl.
CPC .......... *H01L 23/50* (2013.01); *H01L 23/49562* (2013.01); *H01L 23/49589* (2013.01); *H01L 2224/48091* (2013.01); *H01L 2224/48247* (2013.01); *H01L 2224/49171* (2013.01)

(58) Field of Classification Search
CPC ............ H01L 23/495; H01L 23/49562; H01L 23/49589; H01L 23/50; H01L 2224/48091; H01L 2224/48247

USPC .......................................................... 361/782
See application file for complete search history.

(56) References Cited

U.S. PATENT DOCUMENTS

| | | | |
|---|---|---|---|
| 6,378,514 B1 * | 4/2002 | Kaminaga et al. | 123/633 |
| 2007/0007631 A1 * | 1/2007 | Knittl | 257/666 |
| 2010/0109136 A1 | 5/2010 | Yamada et al. | |

FOREIGN PATENT DOCUMENTS

| | | |
|---|---|---|
| DE | 101 02 440 C1 | 5/2002 |
| JP | 57-118661 A | 7/1982 |

* cited by examiner

*Primary Examiner* — Tremesha S Willis
*Assistant Examiner* — Michael E Moats, Jr.
(74) *Attorney, Agent, or Firm* — Muncy, Geissler, Olds & Lowe, P.C.

(57) ABSTRACT

A device having an integrated circuit and a circuit package. A first terminal contact, a second terminal contact, and a third terminal contact are brought out of the circuit package. The first terminal contact and the second terminal contact are each connected to terminals of the integrated circuit for power supply. The third terminal contact is connected to a terminal of the integrated circuit in the circuit package for signal transmission. A first capacitor is connected to the first terminal contact and a second capacitor is connected to the third terminal contact, wherein a fourth terminal contact and a fifth terminal contact are brought out of the circuit package, and the first capacitor is connected to the fourth terminal contact, and the second capacitor is connected to the fifth terminal contact.

2 Claims, 2 Drawing Sheets

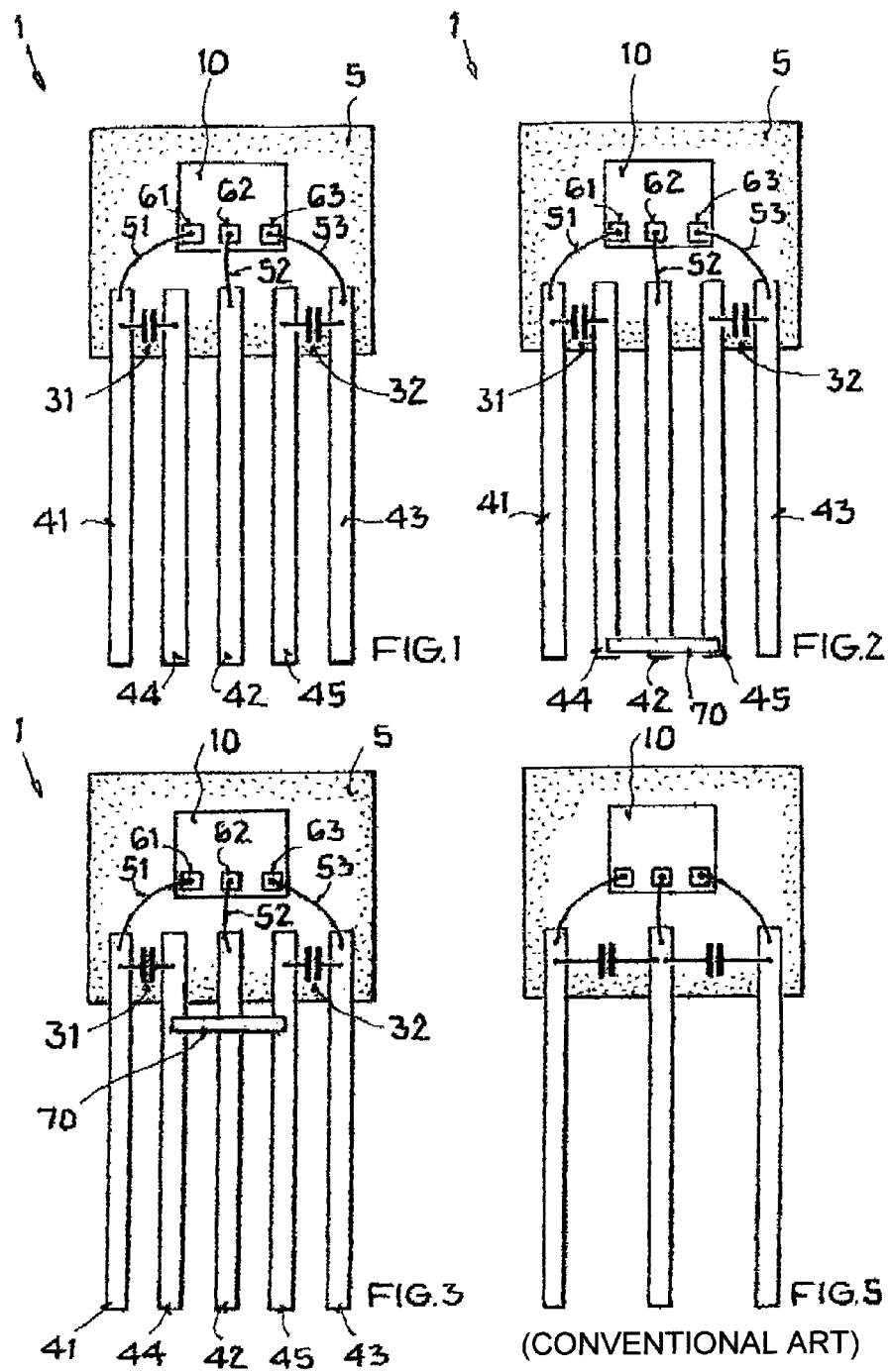

DEVICE WITH AN INTEGRATED CIRCUIT

This nonprovisional application claims priority to German Patent Application No. DE 10 2011 118 932, which was filed in Germany on Nov. 21, 2011, and to U.S. Provisional Application No. 61/563,998, which was filed on Nov. 28, 2011, and which are both herein incorporated by reference.

BACKGROUND OF THE INVENTION

1. Field of the Invention

The present invention relates to a device with an integrated circuit.

2. Description of the Background Art

Known from JP 57118661 A is a device with an integrated circuit. The device has an integrated circuit built into a circuit package, multiple terminal contacts, and a discrete capacitor integrated into the circuit package. In this design, a first terminal contact for the power supply and a second terminal contact are connected to a reference voltage.

In addition, from DE 101 02 440 C1 is known a circuit package for an integrated circuit and a discrete capacitor additionally integrated into the circuit housing.

SUMMARY OF THE INVENTION

It is therefore an object of the present invention to provide a device that further improves the conventional the art.

According to an embodiment of the invention, a device is provided having an integrated circuit and a circuit package with a first terminal contact and a second terminal contact and a third terminal contact, wherein the first terminal contact and the second terminal contact and the third terminal contact are brought out of the circuit package, and the first terminal contact is implemented as a power supply terminal and the second terminal contact is implemented as a reference voltage terminal, and the first terminal contact and the second terminal contact are connected to the integrated circuit within the circuit package, and the third terminal contact is connected to the integrated circuit in the circuit package as a signal transmission terminal, and also having a first capacitor and a second capacitor, wherein the first capacitor and the second capacitor are integrated into the circuit package, and the first capacitor is connected to the first terminal contact and the second capacitor is connected to the third terminal contact, wherein a fourth terminal contact and a fifth terminal contact are provided and the fourth and fifth terminal contacts are each brought out of the circuit package, and the first capacitor is connected to the fourth terminal contact and the second capacitor is connected to the fifth terminal contact.

The first capacitor forms a connection between the first terminal contact and the fourth terminal contact. Moreover, the second capacitor forms a connection between the third terminal contact and the fifth terminal contact. Furthermore, the first terminal contact, second terminal contact, third terminal contact, fourth terminal contact, and fifth terminal contact are each distinct terminal contacts.

It is an advantage that, as a result of the integration of capacitors that are not already connected at the relevant second terminal of the applicable capacitor to a reference voltage, preferably to ground, additional applications can be opened up for the device without integration of the capacitors having an effect on the measurement program or the measurement routines. As a result of the advantageous method of connection of the capacitors, the measurement times at the terminal contacts of the supply voltage and the reference voltage are not lengthened in comparison to the measurement times of the relevant contact terminals without integrated capacitors connected, especially in the case of final test of the circuits. In addition, the measurement results for measurements in the high frequency region, for example above 1 MHz, are not invalidated by the integrated capacitors. Furthermore, the integrated capacitors can still be connected to the reference voltage as well as to additional external circuit components both before and after the final test measurement. Because freely configurable terminal contacts are additionally incorporated in the present case, the flexibility of the device can be increased considerably.

In an embodiment, no electrical connection is present between the fourth terminal contact and the integrated circuit within the circuit package. According to another embodiment, no electrical connection is implemented between the fifth terminal contact and the integrated circuit within the circuit package. An advantage of both the foregoing embodiments, which is to say by means of the single-sided connection, is that a test of the integrated circuit can be carried out without effects on the integrated circuit from the integration of the first capacitor and/or of the second capacitor. To this end, only the first terminal contact and/or the second terminal contact and/or the third terminal contact is connected to a test unit in a first step.

In an embodiment, the fourth terminal contact can be located between the first terminal contact and the second terminal contact, while the fifth terminal contact is located between the second terminal contact and the third terminal contact. An advantage of this arrangement resides in a simple option for connecting the second terminal contact, implemented as the reference voltage terminal, to the fourth terminal contact and/or to the fifth terminal contact. As a result of the direct sequence of the three terminal contacts, it is possible to use simple, straight wire sections or jumpers, for example, for connecting the directly adjacent terminal contacts without implementing specially shaped wires for skipping terminal contacts that are not to be connected.

According to another embodiment, the second terminal contact and/or the fourth terminal contact and/or the fifth terminal contact can be shorted to one another outside the circuit package in a first third of the overall length of the terminal contacts formed outside the circuit package. Alternatively or in addition thereto, the second terminal contact and/or the fourth terminal contact and/or the fifth terminal contact are shorted to one another outside the circuit package in a third third of the overall length of the terminal contacts formed outside the circuit package.

A particular advantage of the embodiments is that a different functionality of the device as compared to the preceding enhancements results from connecting the terminal contacts. The different functionality resides, for example, in that the integrated capacitors now function as interference filters for the supply voltage, in contrast to test operation, which is to say in operation with capacitors connected on only one side. It is advantageous in this regard that the functionality can be established at any time. Investigations have shown that the device can also be delivered without the short circuit of the second terminal contact and/or of the fourth terminal contact and/or of the fifth terminal contact, thereby providing a user with great flexibility in circuit design. It is especially advantageous here that a cost saving due to reduced effort in testing of the circuits arises in production despite the introduction of two additional terminal contacts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a schematic view of an embodiment of the device according to the invention;

FIG. 2 shows a schematic view of an embodiment of the device according to the invention;

FIG. 3 shows a schematic view of an embodiment of the device according to the invention;

FIG. 5 shows a schematic view of a device according to the conventional art.

DETAILED DESCRIPTION

Figure 4:
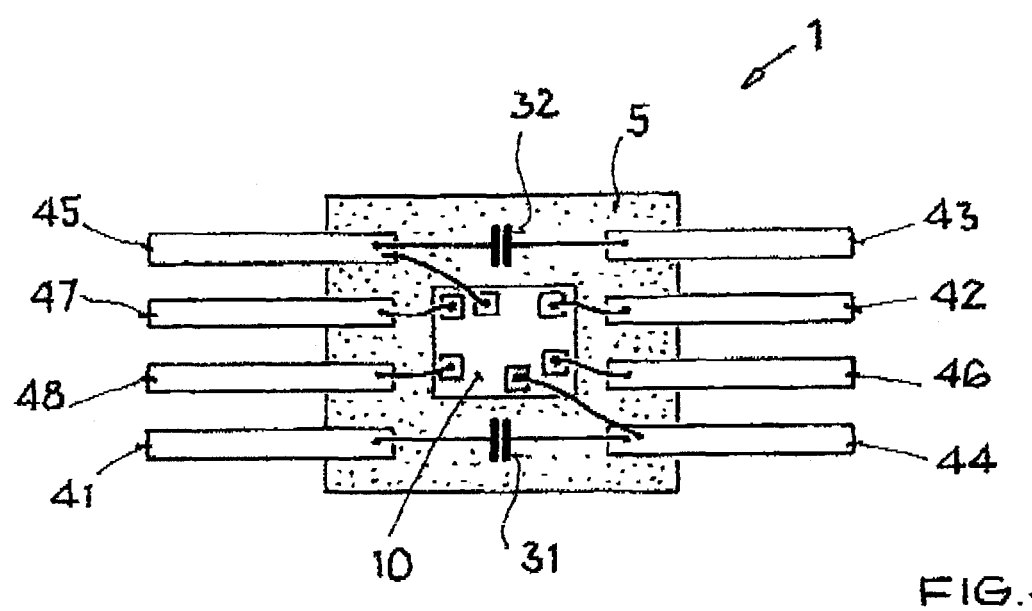
FIG. 4 shows a schematic view of an embodiment of the device according to the invention.

The diagram in FIG. 1 shows a schematic view of a first embodiment of a device 1, having a circuit package 5 and a circuit 10 integrated within the circuit package 5. A first terminal contact 41 and a second terminal contact 42 and a third terminal contact 43 and a fourth terminal contact 44 and a fifth terminal contact 45 are brought out of the circuit package 5. The terminal contacts 41, 42, 43, 44, 45 are arranged in a row and parallel to one another. From left to right, the first terminal contact 41 is followed by the fourth terminal contact 44, then the second terminal contact 42, then the fifth terminal contact 45, and lastly the third terminal contact 43. The first terminal contact 41 is connected in the circuit package 5 to a first contact area 61 on the integrated circuit 10 by a first bonding wire 51. The second terminal contact 42 is connected in the circuit package 5 to a second contact area 62 on the integrated circuit 10 by a second bonding wire 52. The third terminal contact 43 is connected in the circuit package 5 to a third contact area 63 on the integrated circuit 10 by a third bonding wire 53. Also integrated in the circuit package are a first capacitor 31 and a second capacitor 32. The first capacitor 31 is connected to the first terminal contact 41 and to the fourth terminal contact 44. The second capacitor 32 is connected to the third terminal contact 43 and to the fifth terminal contact 45.

Another embodiment of the device 1 is shown in the diagram in FIG. 2. Only the differences from the diagram in FIG. 1 shall be explained below. At the bottom end, which is to say in the third third of the terminal contacts 42, 44, 45, a jumper 70 is formed at right angles between the terminal contacts 42, 44, 45. The jumper 70 establishes a short circuit between the fourth terminal contact 44, the third terminal contact 43, and the fifth terminal contact 45.

Another embodiment of the device 1 is shown in the diagram in FIG. 3. Only the differences from the diagram in FIG. 1 shall be explained below. Outside of the circuit package 5, directly at the location where the terminal contacts 42, 44, 45 are brought out, which is to say in a first third, a jumper 70 is formed parallel to the circuit package 5. The jumper 70 establishes a short circuit between the fourth terminal contact 44, the third terminal contact 43, and the fifth terminal contact 45, and is made of a metal strip, for example. The metal strip is connected directly to the second terminal contact 42 and the fourth terminal contact 44 and the fifth terminal contact 45 by soldering, for example.

Another embodiment of the device 1 is shown in the diagram in FIG. 4. Only the differences from the preceding figures shall be explained below. Accordingly, another form of the circuit package 5 is provided. The circuit package 5 now has a sixth terminal contact 46, a seventh terminal contact 47, and an eighth terminal contact 48. Furthermore, the terminal contacts 41, 48, 47, and 45 are located on opposite sides of the circuit package 5 with respect to the terminal contacts 44, 46, 42, and 43. The additional terminal contacts 46, 47, 48 preferably are implemented as signal terminals for the integrated circuit 10.

It is a matter of course that the terminal contacts are very different and are not arranged in a row, depending on the execution of the circuit package. Accordingly, capacitors, and also, in particular, additional passive components with additional terminal contacts, may also be integrated in the circuit package in accordance with the present inventive idea.

In FIG. 5, a device according to the prior art, as already mentioned in the introduction to the description, is illustrated in abstract form.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device comprising:
an integrated circuit;
a circuit package having a first terminal contact, a second terminal contact, and a third terminal contact, the first terminal contact and the second terminal contact and the third terminal contact are brought out of the circuit package, the first terminal contact is configured as a power supply terminal and the second terminal contact is configured as a reference voltage terminal, the first terminal contact and the second terminal contact are connectable to the integrated circuit within the circuit package, the third terminal contact is connectable to the integrated circuit in the circuit package as a signal transmission terminal;
a first capacitor;
a second capacitor, the first capacitor and the second capacitor being integrated into the circuit package, the first capacitor being connectable to the first terminal contact and the second capacitor being connectable to the third terminal contact; and
a fourth terminal contact and a fifth terminal contact, the fourth terminal contact and fifth terminal contact are each brought out of the circuit package, wherein
the first capacitor is connectable to the fourth terminal contact and the second capacitor is connectable to the fifth terminal contact, and
the second terminal contact and the fourth terminal contact and the fifth terminal contact are shorted to one another outside the circuit package in a third third of an overall length of the terminal contacts formed outside the circuit package.

2. The device according to claim 1, wherein the second terminal contact and the fourth terminal contact and the fifth terminal contact are shorted to one another outside the circuit package in a first third of an overall length of the terminal contacts formed outside the circuit package.

\* \* \* \* \*